United States Patent [19]
Greim et al.

[11] Patent Number: 5,260,658
[45] Date of Patent: Nov. 9, 1993

[54] DETUNING CIRCUIT FOR RESONATORS IN A NUCLEAR MAGNETIC RESONANCE IMAGING APPARATUS

[75] Inventors: Helmut Greim, Adelsdorf; Juergen Ruhl, Erlangen; Ralph Oppelt, Weiher, all of Fed. Rep. of Germany

[73] Assignee: Siemens Aktiengesellschaft, Munich, Fed. Rep. of Germany

[21] Appl. No.: 802,542

[22] Filed: Dec. 5, 1991

[30] Foreign Application Priority Data

Dec. 10, 1990 [DE] Fed. Rep. of Germany ....... 4039409

[51] Int. Cl.$^5$ ............................................. G01B 33/20
[52] U.S. Cl. .................................................. 324/322
[58] Field of Search ............... 324/300, 307, 309, 318, 324/322; 128/653.5

[56] References Cited

U.S. PATENT DOCUMENTS 4,801,885 1/1989 Meissner et al. .................... 324/318

FOREIGN PATENT DOCUMENTS

| 0317090 | 5/1989 | European Pat. Off. . |
| 0389868 | 3/1990 | European Pat. Off. . |
| 3133432 | 3/1983 | Fed. Rep. of Germany . |

OTHER PUBLICATIONS

"Human in Vivo Phosphate Metabolite Imaging with $^{31}$P NMR" Bottomley et al., Magnetic Resonance in Medicine 7 (1988) pp. 319–336.
"Taschenbuch der Hochfrequenztechnik," Meinke et al. (1956) pp. 185–187.
Patent Abstracts of Japan, P-453 vol. 10, No. 119, May 6, 1986, Application No. 59-103380.

*Primary Examiner*—Michael J. Tokar
*Attorney, Agent, or Firm*—Hill, Steadman & Simpson

[57] ABSTRACT

A circuit for detuning a resonator in a nuclear magnetic resonance imaging apparatus has an output connected to a terminal of the resonator via a high-frequency line composed of two conductors. The resonator is shortened at this terminal with a shorting capacitor that can be short-circuited for detuning the resonator. The length of the high-frequency line is shorter than one-fourth of the wavelength of a high-frequency signal having the operating frequency of the nuclear magnetic resonance imaging apparatus on the high-frequency line. For detuning the resonator the high-frequency line can be terminated at the output with a further capacitor, so that the high-frequency line acts as a short-circuit at the terminal.

8 Claims, 1 Drawing Sheet

DETUNING CIRCUIT FOR RESONATORS IN A NUCLEAR MAGNETIC RESONANCE IMAGING APPARATUS

BACKGROUND OF THE INVENTION

1. Field of the Invention

The present invention is directed to a circuit for detuning a resonator in a nuclear magnetic resonance imaging apparatus having an output connected to a terminal of a resonator via a high-frequency line composed of two lines, and wherein the resonator is shortened at its terminal with a shortening capacitor, which can be shorted for detuning the resonator.

2. Description of the Prior Art

In a nuclear magnetic resonance imaging apparatus (NMR apparatus), a magnetic high-frequency field is required in addition to the basic magnetic field and the gradient fields. The high-frequency fields are generated by resonators or antennas that can be classified as follows according to their function:

(1) The transmission antenna is also the reception antenna; substantially the entire body can be exposed to a high-frequency field with this antenna, which is therefore also called body resonator;

(2) The transmission antenna is the body resonator and the reception antenna is a special antenna that is smaller than the body resonator;

(3) The special antenna is the transmission and reception antenna.

Special antennas are employed to register tomograms of sub-areas of the human body such as, for example, tomograms of the knee, the head or the eye.

In order not to disturb the magnetic high-frequency field of the special antennas, the permanently integrated body resonator must be detuned when the special antennas are activated. Body resonators often have their length shortened at their terminals or feed points by shorting capacitors, which are then short circuited via switches for detuning. This solution requires high-frequency switches that must be directly arranged at the resonators. In addition to the high-frequency lines, therefore, control lines for the high-frequency switches are also conducted to the resonators in this type of known circuit.

A detuning circuit disclosed in U.S. Pat. No. 4,801,885 wherein the input of the high-frequency lines to the resonators is short-circuited for detuning the resonators. The short-circuit is effected by a quarter-wave transmission line connected to the input of the high-frequency line, this quarter-wave transmission line being operated no load at its other end for detuning. As used herein, $\lambda$ stands for the wavelength of an electromagnetic wave having the operating frequency of the nuclear magnetic resonance imaging apparatus on the line. In addition to the high-frequency lines whose length must be exactly equal to the length of the resonators in order to avoid phase errors, further line sections are required whose length must be exactly $\lambda/4$. This requires high-precision manufacture of both the high-frequency line the quarter-wave transmission line.

The magnetic high-frequency field should be substantially uniform in the nuclear magnetic resonance imaging apparatus. The body resonator is therefore composed of two resonators lying opposite one another that are fed by high-frequency signals that are phase-shifted by 180° relative to one another. The structure of body resonators and the in-phase feeding of the high-frequency signals is disclosed by German Published Application 31 33 432. The manner by which a transmission signal generated by a transmitter can be uniformly divided onto the two resonators lying opposite one another is also disclosed therein. In a first version, the feed points of the two resonators lie opposite one another at identical ends. The 180° phase shift is achieved by an intervening conductor section having a length of $\lambda/2$. In another version, the current is supplied proceeding from different sides. In this case, the leads for the two resonators lying opposite one another must be of the same length. The employment of relatively long conductor sections is disadvantageous in these two versions.

A balancing circuit at whose output two signals out of phase by 180° and being symmetrical relative to a reference potential are present is known from FIG. 2 of the article by Bottomley et al., "Human in Vivo Phosphate Metabolite Imaging with 31P NMR". This article is published in Magnetic Resonance in Medicine 7, 1988, pages 319–336. The balancing circuit therein is referred to as a "balun" and is used to connect a balanced-to-ground resonator in an NMR apparatus to an unbalanced-to-ground high-frequency line, for example a coaxial line.

SUMMARY OF THE INVENTION

It is an object of the present invention to provide a detuning circuit with which a body resonator permanently integrated in the nuclear magnetic resonance imaging apparatus can be detuned without significant outlay.

This object is achieved in accordance with the principles of the present invention in a detuning circuit wherein the length of the high-frequency line is less than one-fourth of the wavelength of a high-frequency signal having the operating frequency of the nuclear magnetic resonance imaging apparatus on the high-frequency line, and wherein the high-frequency line can be terminated with a capacitor at the output for detuning the resonator, so that the high-frequency line acts as a short-circuit at the terminal.

Even though the shorting capacitor arranged directly at the resonators continues to be short-circuited, no further control lines other than the high-frequency line lead to the resonator. The high-frequency line, which itself is shorter than one-fourth the wavelength, is electrically lengthened by the capacitor for detuning. The capacitance value of the capacitor is selected such that the high-frequency line acts like a quarter-wave ($\lambda/4$) transmission line open at its input. The high-frequency line therefore acts as a short-circuit at the terminal of the resonator. Tolerances in the manufacture of the high-frequency line can be compensated by a suitable selection of the capacitance value.

An especially advantageous embodiment has a parallel circuit, formed by the capacitor with a high-frequency switch, arranged in series with a high-frequency switch arrangement at the output between the two conductors of the high-frequency line, with the high-frequency signal being supplied to the junction node of the parallel circuit with the high-frequency switch arrangement. The high-frequency switch is opened for detuning the resonator and the high-frequency switch arrangement acts as a closed high-frequency switch. Particularly advantageous is the low voltage load on the high-frequency switch, because it is closed in transmission mode and is only loaded with extremely weak reception signals when detuning the resonator. Further, the connected electronics is applied to reference potential via the high-frequency switch arrangement during detuning.

In a further, advantageous development the capacitor can be tuned. Tolerances after integration of the capacitor, for example upon initialization, can thus be compensated.

In a further embodiment the high-frequency switch arrangement includes a first series resonant circuit formed by a first series capacitor in series with a series branch composed of a second series capacitor and a first series coil. This series branch is bridged by a bridging switch. The first series resonant circuit is tuned to the operating frequency of the nuclear magnetic resonance imaging apparatus, whereby the high-frequency switch arrangement behaves as a closed high-frequency switch when the bridging switch is opened.

In an alternative embodiment the high-frequency switch arrangement includes a second series resonant circuit formed by a third series capacitor and a second series coil. The third series capacitor is bridged with a bridging switch. The second series resonant circuit is tuned to the operating frequency of the nuclear magnetic resonance imaging apparatus, whereby the high-frequency switch arrangement behaves as a closed high-frequency switch when the bridging switch is opened. In these two latter embodiments, the bridging switches are closed during transmission mode. The low voltage load of the bridging switches is thereby advantageous. They are opened for detuning the resonator, so that they are then only loaded by the low reception voltage.

An especially advantageous employment of the detuning circuit is in a detuning circuit combination in a nuclear magnetic resonance imaging apparatus for detuning and for feeding a high-frequency signal delivered by a high-frequency transmitter into two resonators lying opposite one another. The detuning circuit combination has an input and two outputs. The input can be connected to the high-frequency transmitter and one output is connected via a high-frequency line composed of two conductors to a terminal of one of the resonators. The resonators are shortened with shortening capacitors at their terminals, these shortening capacitors being capable of being short-circuited for detuning the resonators. This detuning circuit combination has a series coil arranged between the input and the first output and a parallel circuit of a capacitor and a high-frequency switch arranged in series with the series coil. A first series resonant circuit is arranged in a shunt arm at the connection between the series coil and the parallel circuit, this series resonant circuit being formed by a first series capacitor in series with a series branch formed by a second series capacitor and a first series coil. This series branch is bridged with a bridging switch. A second parallel circuit of the capacitor with the high-frequency switch is arranged between and in series with the input and the second output of a series capacitor. A second series resonant circuit is arranged in the shunt arm at the connection between the second parallel circuit and the series capacitor. This second series resonant circuit is formed by a third series capacitor and a second series coil. The third series capacitor is bridged with a bridging switch. The values of the series coil, the first series capacitor, the series capacitor and the first series coil represent an identical reactive impedance for the operating frequency of the nuclear magnetic resonance imaging apparatus and the signals at the outputs are thus out of phase by 180° relative to one another, given a closed high-frequency switch and a closed bridging switch. The first and the second series resonant circuit are tuned to the operating frequency of the nuclear magnetic resonance imaging apparatus. The high-frequency lines to the two resonators are of identical length, having a length of less than one-fourth of the wavelength of a high-frequency signal having the operating frequency of the nuclear magnetic resonance imaging apparatus on the high-frequency line. Each high-frequency line can be terminated with the capacitor at the output for detuning the resonators, so that the high-frequency line at the terminal acts as a short-circuit.

This detuning circuit combination has the advantage that some of the component parts for detuning the resonators are also employed for phase rotation and for a uniform division of the high-frequency signals supplied by the high-frequency transmitter onto the two resonators.

DESCRIPTION OF THE PREFERRED EMBODIMENTS

Figure 1:
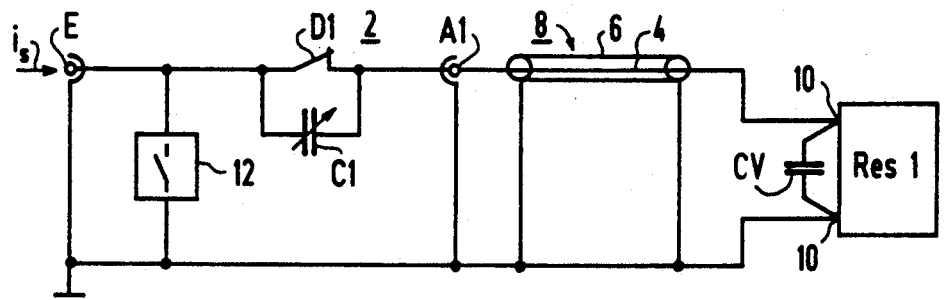
FIG. 1 is a schematic circuit diagram of a detuning circuit constructed in accordance with the principles of the present invention.

FIG. 1 shows a detuning circuit 2 having an input E and an output A1. The input E can be connected to a high-frequency transmitter (not shown). The output A1 is connected to a terminal 10 of a resonator Res1 via a high-frequency line 8 composed of two conductors 4 and 6. The resonator Res1 is constructed as a $\lambda/2$ resonator, ($\lambda$ identifies the wavelength of a wave in the resonator Res1 with the operating frequency of the nuclear magnetic resonance imaging apparatus). A shorting capacitor CV is connected to the terminal of the resonator Res1 between the two connecting lines 4 and 6. The actual length of the resonator Res1 is thereby executed shorter than $\lambda/2$.

The length of the high-frequency line 8 is less than one-fourth of the wavelength of a high-frequency signal having the operating frequency of the nuclear magnetic resonance imaging apparatus on the high-frequency line 8.

The high-frequency line 8 can be terminated at the output A1 of the detuning circuit 2 with a capacitor C1. The capacitance of the capacitor C1 is selected such that the high-frequency line 8 is electrically lengthened by the capacitor C1 to form a $\lambda/4$ (quarter-wave) transmission line that is "no load" at the output A1. The $\lambda/4$ transmission line at the terminal 10 of the resonator Res1 thus acts as a short-circuit for the shorting capacitor CV. The resonant frequency of the detuned resonator Res1 is thus shifted toward lower values with reference to the operating frequency. The influence of the resonator Res1 on high-frequency fields having the operating frequency is thus kept small.

A high-frequency switch D1 is arranged parallel to the capacitor C1 in the detuning circuit 2. A high-frequency switch arrangement 12 is connected in series with this parallel circuit. The parallel circuit of the capacitor C1 with the high-frequency switch D1 in series with the high-frequency switch arrangement 12 thus lies at the output A1 between the two conductors 4 and 6 of the high-frequency line 8. The input E of the detuning circuit 2 lies at the connection of the high-frequency switch arrangement 12 to the parallel circuit of the capacitor C1 and the high-frequency switch D1.

In the transmission mode, i.e. when a high-frequency signal $i_s$ is supplied from the high-frequency transmitter to the resonator Res1, the high-frequency switch D1 is closed and the high-frequency switch arrangement 12 acts as an open high-frequency switch. The detuning circuit 2 thus has no influence during the transmission mode. When, upon activation of special antennas, the resonator Res1 is to be detuned, the high-frequency switch D1 is opened and the high-frequency switch arrangement 12 is controlled such that it acts as a closed high-frequency switch. In this operating condition, the capacitor C1 terminates the high-frequency line. A particular advantage of this circuit is that the input E is applied to reference potential via the high-frequency switch arrangement 12. One thus avoids having noise signals proceed via the input E to an electronics channel connected to the input E.

The capacitor C1 is executed as a tunable capacitor in order to compensate manufacturing tolerances of the high-frequency line 8.

Figure 2:
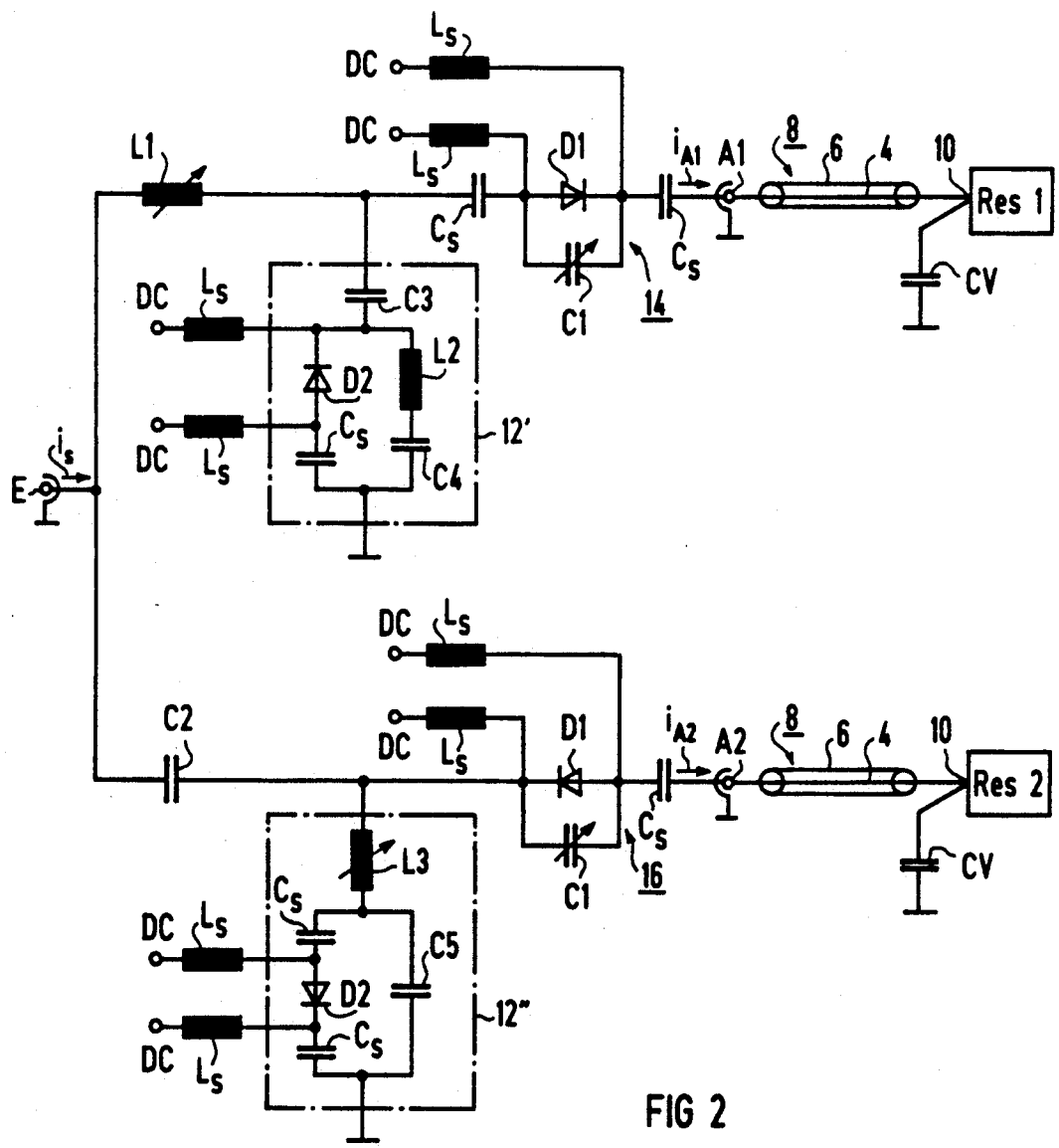
FIG. 2 is a circuit diagram detuning combination constructed in accordance with the principles of the present invention, suitable for detuning two resonators and for generating the phase rotation of the high-frequency signal for feeding two antennas that lie opposite one another.

A detuning circuit combination in a nuclear magnetic resonance imaging apparatus, for detuning and for feeding a high-frequency signal $i_s$ supplied by a high-frequency transmitter into two resonators Res1 and Res2 that lie opposite one another, is shown in FIG. 2. The capacitors $C_s$ and the coils $L_s$ in the circuit shown in FIG. 2 serve for the DC decoupling of the PIN diodes D1 and D2 set forth below. They have no influence on the high-frequency behavior of the circuit.

The detuning circuit combination has an input E and two outputs A1 and A2, whereby the input E can be connected to the high-frequency transmitter and one output A1 or A2 is connected to the terminal 10 of one of resonators Res1 and Res2 via a high-frequency line 8 composed of two conductors 4 and 6. The resonators Res1 and Res2 are shorting at their terminals 10 with shortening capacitors CV. The high-frequency signal $i_s$ supplied by the transmitter is divided by the detuning circuit combination into two transmission signals $i_{A1}$ and $i_{A2}$ of identical size that are out of phase by 180°. The resonators Res1 and Res2 can thus be supplied at the same end via high-frequency lines 8 each having the same length.

The high-frequency switches D1 are PIN diodes that have a transmissive condition for high-frequency signals given direct current and have an inhibiting condition for high-frequency signals given a blocking DC voltage.

A series coil L1 and, in series therewith, a first parallel circuit 14 of the capacitor C1 with a PIN diode D1 utilized as high-frequency switch is arranged between the input E and the first output A1. A high-frequency switch arrangement 12' is arranged in the shunt arm at the junction of series coil L1 and first parallel circuit.

A series capacitor C2 and, in series therewith, a second parallel circuit 16 of a capacitor C1 with a PIN diode D1 utilized as high-frequency switch is arranged between the input E and the second output A2. A high-frequency switch arrangement 12" is arranged in the shunt arm at the junction of series capacitor C2 and second parallel circuit 16.

The high-frequency switch arrangements 12' and 12" each include a series resonant circuit that is tuned to the operating frequency of the nuclear magnetic resonance imaging apparatus and that can be activated as set forth below for detuning the resonators.

In the high-frequency switch arrangement 12' in the upper part of FIG. 2, a first series resonant circuit is formed by a first series capacitor C3 in series with a series circuit composed of a first series coil L2 and a second series capacitor C4. The series circuit composed of the second series capacitor C4 and the first series coil L2 is thereby bridged with a PIN diode D2 as bridging switch.

The high-frequency switch arrangement 12" is a modification of the high-frequency switch arrangement 12'. The high-frequency switch arrangement 12" is composed of a second series resonant circuit including a second series coil L3 and a third series capacitor C5. By contrast to the high-frequency switch arrangement 12', however, a PIN diode D2 is arranged herein as a bridging switch parallel to the third series capacitor C5.

The series inductance L1 and the first series capacitor C3 as well as the series capacitor C2 and the second series coil L3 have the same reactive impedance at the operating frequency of the nuclear magnetic resonance imaging apparatus. The coils L1 and L3 can be tuned for compensating tolerances.

The control signal is supplied to the PIN diodes D1 and D2 via the terminals DC as a DC signal. The control of the PIN diodes D1 and D2 is high-frequency decoupled from the detuning circuit combination by coils $L_s$. Blocking capacitors $C_s$ assure that the control signals only act on the individual PIN diodes D1 and D2.

In the transmission mode, the high-frequency switches D1 and the bridging switches D2 are transmissive, i.e., in the upper circuit part only the series coil L1 is effective in the series arm between the input E and the output A1 and only the first series capacitor C3 is effective at the output A1 in the shunt arm. The analogous case applies to the lower circuit part, namely that the series capacitor C2 is effective between the input E and the output A2 and the second series coil L3 is effective in the shunt arm at the output A2. Since all reactances have the same value, the high-frequency signals $i_{A1}$ and $i_{A2}$ supplied at the outputs A1 and A2 are out of phase by 180° relative to one another. The resonators Res1 and Res2 can thus be supplied from the same side with lines of the same length.

For detuning the resonators Res1 and Res2, the high-frequency switches D1 and the bridging switches D2 are inhibited. The high-frequency lines 8 are now terminated with the capacitors C1 and act as a short-circuit at the terminals 10. The input E is applied to reference potential via the high-frequency switch arrangements 12' and 12".

Although modifications and changes may be suggested by those skilled in the art, it is the intention of the inventors to embody within the patent warranted hereon all changes and modifications as reasonably and properly come within the scope of their contribution to the art.

We claim as our invention:

1. A circuit for detuning a resonator in a nuclear magnetic resonance imaging apparatus, said apparatus having an operating frequency with an associated wavelength, said resonator having a terminal with a shorting capacitor connected thereacross which can be short-circuited for detuning said resonator, said circuit comprising:

a high-frequency line formed by two conductors having one end connected directly to said terminal of said resonator for transmitting signals to and taking signals from said resonator, said high-frequency line having a length which is shorter than one-quarter of said wavelength of said operating frequency; and capacitive means connected to an opposite end of said high-frequency line for causing said high frequency line to behave as a short-circuit at said terminal for detuning said resonator.

2. A circuit as claimed in claim 1 wherein said capacitive means is a parallel circuit formed by a capacitor connected across a high-frequency switch, and said parallel circuit being connected in series with a high-frequency switch arrangement connected at said opposite end of said high-frequency line across said two conductors, said capacitive means having an input for a high-frequency signal at a junction between said parallel circuit and said high-frequency switch arrangement, said high-frequency switch being opened for detuning said resonator and said high-frequency switch arrangement behaving as a closed switch.

3. A circuit as claimed in claim 1 wherein said capacitor in said parallel circuit is a tuneable capacitor.

4. A circuit as claimed in claim 2 wherein said high-frequency switch arrangement comprises:

a series resonant circuit formed by a series capacitor connected in series with a series circuit formed by a second series capacitor and a series coil;

a bridging switch connected across said series circuit; and said series resonant circuit being tuned to said operating frequency of said nuclear magnetic resonance imaging apparatus and said high-frequency switch arrangement behaving as a closed switch when said bridging switch is open.

5. A circuit as claimed in claim 1 wherein said high-frequency switch arrangement comprises:

a series resonant circuit formed by a series capacitor and a series coil;

a bridging switch connected across said series capacitor; and said series resonant circuit being tuned to the operating frequency of said nuclear magnetic resonance imaging apparatus, and said high-frequency switch arrangement behaving as a closed switch when said bridging switch is open.

6. A circuit for detuning two resonators in a nuclear magnetic resonance imaging apparatus, said apparatus having an operating frequency with an associated wavelength, each resonator having a terminal with a shortening capacitor connected thereacross which can be short-circuited for detuning the resonator, said circuit having an input connectable to a high-frequency transmitter and having first and second outputs, said circuit comprising:

two high-frequency lines having the same length each composed of two conductors respectively connected between said first and second outputs and said resonator terminals, each high-frequency line having a length which is shorter than one-quarter of said wavelength associated with said operating frequency;

a first coil and a first parallel circuit connected in series at a first junction between said input and said first output;

said first parallel circuit consisting of a first capacitor with a first high-frequency switch connected thereacross;

a first shunt branch connected between said first junction and ground containing a first resonant circuit;

said first resonant circuit consisting of a second capacitor connected in series with a branch containing a second coil and a third capacitor connected in series, and a first bridging switch connected across said branch;

a fourth capacitor and a second parallel circuit connected in series at a second junction between said input and said second output;

said second parallel circuit consisting of a fifth capacitor with a second high-frequency switch connected thereacross;

a second shunt branch connected between said second junction and ground containing a second resonant circuit;

said second resonant circuit consisting of a second coil connected in series with a sixth capacitor and a second bridging switch connected across said sixth capacitor;

said first coil and said second capacitor having, in combination, an impedance at said operating frequency which is the same as the impedance of said fifth capacitor and said second coil in combination;

respective signals at said first and second outputs being out of phase by 180° when each of said first and second high-frequency switches and said first and second bridging switches are closed;

said first and second resonant circuits being tuned to said operating frequency; and said high-frequency lines being respectively terminated at said first and second outputs by said first and fifth capacitors so that said high-frequency lines respectively behave as a short circuit at said respective terminals for detuning said resonators.

7. A detuning circuit as claimed in claim 6 wherein said first and second high-frequency switches and said first and second bridging switches are PIN diodes.

8. A circuit as claimed in claim 6 wherein said first and second high-frequency switches are actuatable separately from said first and second bridging switches.

* * * * *